US009826214B2

(12) United States Patent
Cohen et al.

(10) Patent No.: US 9,826,214 B2
(45) Date of Patent: Nov. 21, 2017

(54) VARIABLE RESOLUTION PIXEL

(71) Applicant: Microsoft Technology Licensing, LLC, Redmond, WA (US)

(72) Inventors: David Cohen, Nesher (IL); Erez Tadmor, Tel Aviv (IL); Giora Yahav, Haifa (IL)

(73) Assignee: Microsoft Technology Licensing, LLC., Redmond, WA (US)

( * ) Notice: Subject to any disclaimer, the term of this patent is extended or adjusted under 35 U.S.C. 154(b) by 181 days.

(21) Appl. No.: 14/479,381

(22) Filed: Sep. 8, 2014

(65) Prior Publication Data
US 2016/0073088 A1    Mar. 10, 2016

(51) Int. Cl.
*H04N 13/02* (2006.01)
*H01L 27/146* (2006.01)
(Continued)

(52) U.S. Cl.
CPC ......... *H04N 13/0207* (2013.01); *G01S 3/781* (2013.01); *G01S 7/4816* (2013.01); *G01S 7/4914* (2013.01); *G01S 7/4915* (2013.01); *G01S 17/36* (2013.01); *G01S 17/89* (2013.01); *H01L 27/14607* (2013.01); *H01L 27/14609* (2013.01); *H01L 27/14612* (2013.01); *H01L 27/14627* (2013.01); *H01L 27/14643* (2013.01); *H01L 27/14812* (2013.01); *H04N 5/2254* (2013.01); *H04N 5/23245* (2013.01);
(Continued)

(58) Field of Classification Search
CPC .............. H04N 13/0207; H04N 5/2256; H01L 27/14607; H01L 27/14609; H01L 27/14812; H01L 27/14612; H01L 27/14627; H01L 27/14643
See application file for complete search history.

(56) References Cited

U.S. PATENT DOCUMENTS 5,867,215 A     2/1999  Kaplan
6,331,911 B1 *  12/2001 Manassen ............. B82Y 20/00
                                               257/14
(Continued)

FOREIGN PATENT DOCUMENTS

EP     1118208        11/2004
EP     2346079 A1     7/2011

OTHER PUBLICATIONS

"International Search Report and Written Opinion Issued in PCT Patent Application No. PCT/US2015/048775", dated Oct. 22, 2015, 9 Pages.
(Continued)

*Primary Examiner* — Sath V Perungavoor
*Assistant Examiner* — Philip Dang
(74) *Attorney, Agent, or Firm* — A.C. Entis-IP Ltd.

(57) ABSTRACT

A photosensor having a plurality of light sensitive pixels each of which comprises a light sensitive region and a plurality of storage regions for accumulating photocharge generated in the light sensitive region, a transfer gate for each storage region that is selectively electrifiable to transfer photocharge from the light sensitive region to the storage region, and an array of microlenses that for each storage region directs a different portion of light incident on the pixel to a region of the light sensitive region closer to the storage region than to other storage regions.

20 Claims, 6 Drawing Sheets

(51) Int. Cl.

| | |
|---|---|
| *H01L 27/148* | (2006.01) |
| *H04N 5/225* | (2006.01) |
| *H04N 5/232* | (2006.01) |
| *H04N 5/347* | (2011.01) |
| *H04N 5/374* | (2011.01) |
| *H04N 5/3745* | (2011.01) |
| *G01S 3/781* | (2006.01) |
| *G01S 17/36* | (2006.01) |
| *G01S 17/89* | (2006.01) |
| *G01S 7/481* | (2006.01) |
| *G01S 7/491* | (2006.01) |

(52) U.S. Cl.
CPC ............. *H04N 5/347* (2013.01); *H04N 5/374* (2013.01); *H04N 5/37452* (2013.01)

(56) References Cited

U.S. PATENT DOCUMENTS

| | | | |
|---|---|---|---|
| 7,244,918 B2 | 7/2007 | McKee et al. | |
| 7,283,609 B2 | 10/2007 | Possin et al. | |
| 7,554,587 B2* | 6/2009 | Shizukuishi | H01L 27/14868 |
| | | | 348/272 |
| 7,705,869 B2* | 4/2010 | Tsujino | B41J 2/465 |
| | | | 347/238 |
| 7,924,333 B2* | 4/2011 | Yin | H01L 27/14603 |
| | | | 250/208.1 |
| 8,264,581 B2 | 9/2012 | Cohen et al. | |
| 8,355,074 B2* | 1/2013 | Deever | H04N 5/3456 |
| | | | 348/362 |
| 8,642,938 B2 | 2/2014 | Bikumandla et al. | |
| 8,686,342 B2* | 4/2014 | Hong | H01L 27/14609 |
| | | | 250/208.1 |
| 2003/0136981 A1 | 7/2003 | Sugiyama | |
| 2005/0157194 A1 | 7/2005 | Altice, Jr. | |
| 2008/0291305 A1* | 11/2008 | Kasuga | H04N 5/335 |
| | | | 348/294 |
| 2010/0141821 A1* | 6/2010 | Fossum | H01L 27/14609 |
| | | | 348/308 |
| 2011/0074989 A1* | 3/2011 | Fossum | H04N 5/3696 |
| | | | 348/273 |
| 2011/0164132 A1 | 7/2011 | Buettgen et al. | |
| 2012/0154535 A1* | 6/2012 | Yahav | G01S 7/4863 |
| | | | 348/46 |
| 2012/0326009 A1* | 12/2012 | Salsman | H01L 27/14625 |
| | | | 250/208.1 |
| 2013/0182077 A1* | 7/2013 | Holz | H04N 5/232 |
| | | | 348/46 |
| 2014/0027609 A1 | 1/2014 | Yang et al. | |
| 2014/0125766 A1 | 5/2014 | Cohen et al. | |
| 2014/0131444 A1* | 5/2014 | Wang | G06K 7/10831 |
| | | | 235/454 |

OTHER PUBLICATIONS

Wan, et al., "CMOS Image Sensors With Multi-Bucket Pixels for Computational Photography", In Proceedings of the IEEE Journal of Solid-State Circuits, vol. 47, Issue 4, Apr. 1, 2012, 12 Pages.

Shafie, et al., "A Dynamic Range Expansion Technique for CMOS Image Sensors with Dual Charge Storage in a Pixel and Multiple Sampling", In proceedings of Sensors, Mar. 18, 2008, pp. 1915-1916.

Shafie, et al., "A wide dynamic range CMOS image sensor with dual charge storage in a pixel and a multiple sampling technique", In proceedings of SPIE, vol. 6816, Feb. 29, 2008, 2 pages.

U.S. Appl. No. 13/832,400, Cohen, et al., "Photosensor Having Enhanced Sensitivity", filed Mar. 15, 2013.

* cited by examiner

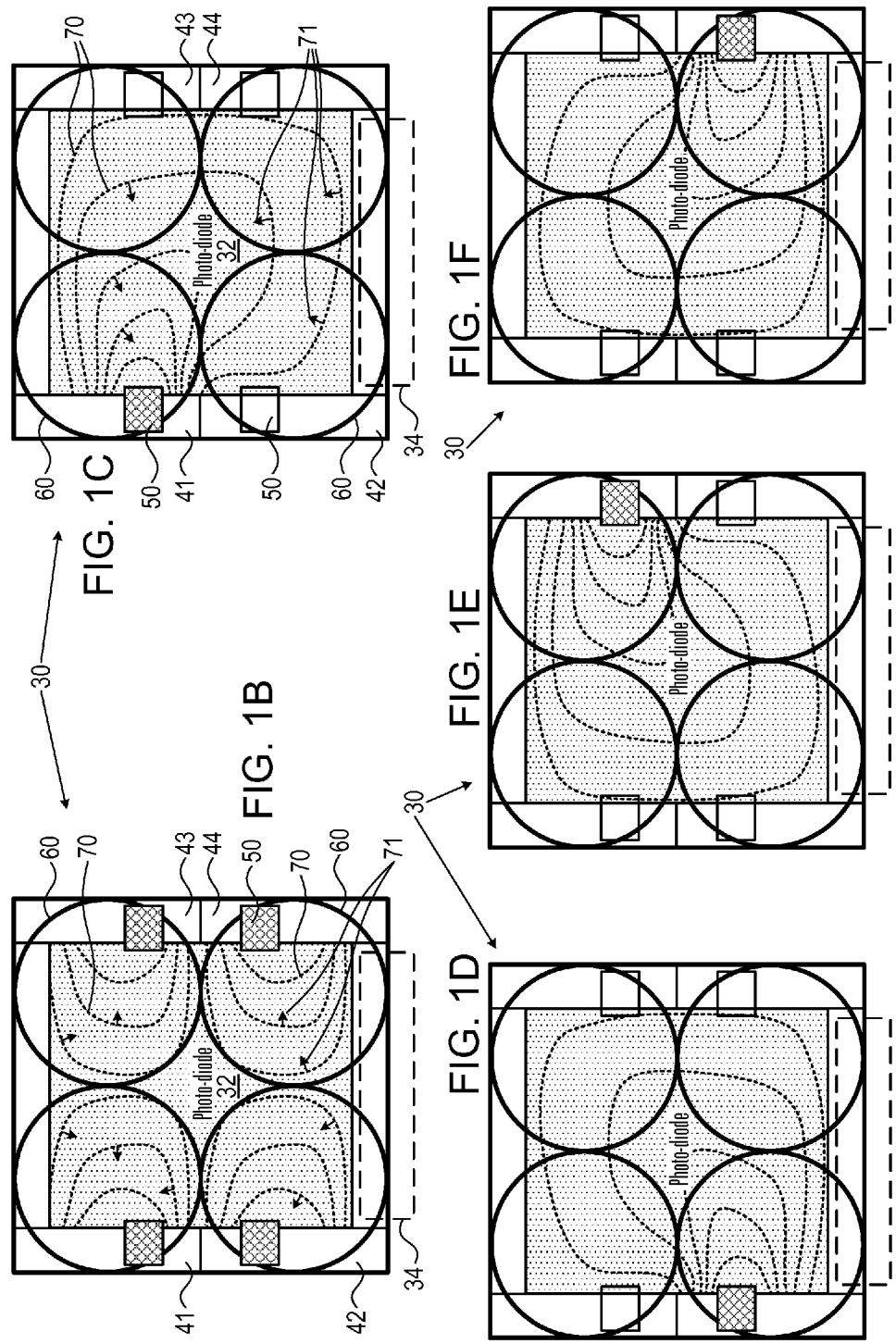

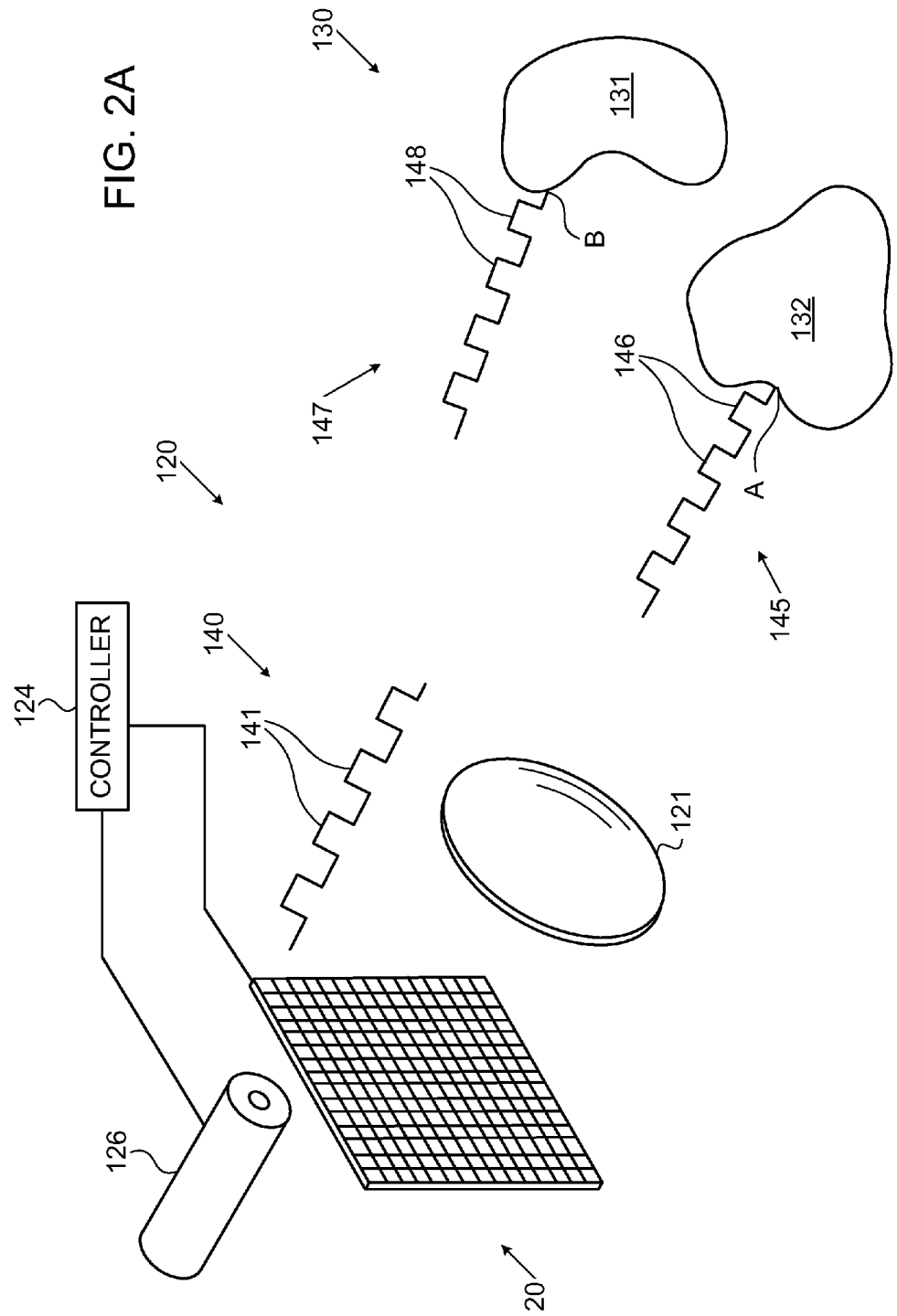

VARIABLE RESOLUTION PIXEL

BACKGROUND

A camera typically comprises a photosensor, such as a CCD (charge coupled device) or CMOS (complimentary metal on silicon) photosensor, on which light from a scene imaged by the camera is focused by the camera's optics during an exposure period of the camera to acquire an image of the scene. The photosensor typically comprises an array of rows and columns of light sensitive pixels that register the light focused by the camera optics on the photosensor. Amounts of light registered by the pixels are determined and used to provide the image of the scene.

A pixel in the photosensor registers incident light from a region of the scene imaged on the pixel by the optics by accumulating positive or negative electric charge provided by electron-hole pairs generated in the pixel by the incident light. Charge provided by electrons or holes from electron-hole pairs generated by light is often referred to as "photocharge". The electron-hole pairs may be generated in a depletion zone of a photodiode comprised in the pixel and the electrons, or holes, are transferred to a storage region of the pixel adjacent the photodiode. Applying a voltage, optionally referred to as a "transfer voltage", to a conductive "transfer" gate overlying the storage region transfers the electrons or holes from the photodiode to the storage region. Photocharge accumulated in the storage regions of pixels in the photosensor is converted to voltage, and a set of voltages provided by the pixels may be used to produce an image of the scene. The set of voltages provided by the photosensor may be referred to as a "frame" of the photosensor. A doping structure of the semiconductor material comprised in the photosensor determines whether pixels in the photosensor accumulate electrons or holes generated by incident light. Usually pixels accumulate electrons, conventionally also referred to as photoelectrons, originating from electron-hole pairs to register incident light.

The exposure period of a camera is generally controllable so that for given imaging conditions under which a scene is imaged, such as focal length of the camera optics and light available from the scene, pixels in the camera's photosensor register sufficient amounts of light to provide a satisfactory image of the scene. For example, for pixels in the photosensor to register sufficient light to provide a satisfactory image of a dimly lit scene, the camera may advantageously be controlled to acquire light from the scene during a relatively long exposure period. To image a brightly lit scene, a relatively short exposure period may be sufficient.

Some special purpose cameras may operate with special constraints on exposure periods. For example, a time of flight (TOF) three dimensional (3D) range camera acquires range images of scenes that it images. The range images provide distances to features in the scenes. The camera determines a distance to a feature in an imaged scene by determining how long it takes light to make a round trip from the camera to the feature and back to the camera. The round trip times may be determined by transmitting pulses of light to illuminate the scene and determining how long it takes light in the transmitted light pulses reflected by the features to propagate from the camera to the features and back to the camera. The camera may register light from the transmitted light pulses that returns from the scene to the camera during each of a plurality of different exposure periods to acquire data for determining the round trip time. The exposure periods may be required to meet relatively stringent constraints on their respective durations, and their respective timing relative to transmission times of the light pulses.

Durations of camera exposure periods are generally functions of sensitivity of pixels in the camera's photosensor to incident light. A photosensor comprising pixels characterized by greater sensitivity to light is generally operable to acquire satisfactory images of a scene for intensities of light from the scene that are lower than light intensities advantageous for imaging the scene using a photosensor having pixels of lesser light sensitivity. Pixel sensitivity to incident light generally increases as size of the photodiode in the pixel increases. For a given exposure period a pixel having a larger photodiode accumulates more photocharge than a pixel having a smaller photodiode. A photosensor comprising larger photodiodes may therefore be able to provide satisfactory images of a scene at lower light intensities than a camera comprising pixels having smaller photodiodes. However, as photodiodes in a photosensor of a camera increase in size, spatial resolution of the photosensor, and an image it produces, decreases.

SUMMARY

An aspect of an embodiment of the invention relates to providing a photosensor, hereinafter also referred to as a "multimode photosensor", comprising photosensitive pixels having spatial resolution controlled by voltage applied to the pixels. In an embodiment, each "multimode pixel" comprises a light sensitive region such as a photodiode or a photogate fabricated using a suitable technology such as CMOS or CCD technology. Each light sensitive region, is associated with a plurality of photocharge storage regions for accumulating photocharge generated in the light sensitive region. Each photocharge storage region is associated with its own transfer gates and at least one microlens. The at least one microlens associated with a given storage region directs light incident on the microlens to a region of the light sensitive region where the light sensitive region converts light to electron-hole pairs that is closer to the given storage region than to other storage regions of the pixel. Hereinafter in the description the light sensitive region of a pixel is assumed for simplicity of presentation to be a photodiode.

When a substantially same appropriate transfer voltage is simultaneously applied to all the pixel's transfer gates, electric fields generated in the photodiode by the transfer voltages operate to transfer photocharge generated in the photodiode from light incident on a given microlens substantially only to the storage region associated with the microlens. Each storage region accumulates photocharge responsive to an amount of light incident on its associated microlens substantially independent of an amount of light incident on the other microlenses in the pixel. The pixel therefore operates as a plurality of smaller pixels optionally equal in number to the number of microlenses. The smaller pixels have reduced dimensions relative to the pixel's native dimensions and concomitant improved spatial resolution, which is substantially determined by the microlens dimensions and applied transfer voltages. When operating with application of a same transfer voltage to all transfer gates of a pixel, the pixel may be said to be operating in a high spatial resolution mode.

When a transfer voltage is applied to only one of the transfer gates, the associated storage region receives photocharge from substantially all regions of the photodiode and the pixel operates as a single, undivided pixel having a spatial resolution determined substantially by its native dimensions. When operating with application of a transfer voltage to only one transfer gate in a pixel, the pixel may be said to be operating in a low spatial resolution mode. A pixel in accordance with an embodiment of the invention operating with a transfer voltage applied to more than one but less than all of its transfer gates the pixel may be said to be operating in an intermediate spatial resolution mode.

In an embodiment of the invention the photodiode and microlenses are configured to exhibit rotational symmetry about an axis substantially at a center of the photodiode and perpendicular to the photosensor. In an embodiment the rotational symmetry is of order greater than or equal to two. Optionally, the order of the rotational symmetry is greater than or equal to four. In an embodiment of the invention a multimode pixel comprises two or more storage regions. In an embodiment a multimode pixel comprises four storage regions.

An aspect of an embodiment of the invention relates to providing a camera comprising the photosensor and a controller that controls voltages applied to the transfer gates of pixels in the photosensor to control spatial resolution of the photosensor and thereby the camera. In an embodiment of the invention the controller controls the voltage responsive to light available from a scene that the camera images. Optionally, the controller controls the photosensor and transfer voltages to determine intensity of light reaching each of the pixels and acquire a contrast image, hereinafter also referred to as a picture, of the scene. In an embodiment, the camera is a TOF-3D camera and the controller controls the photosensor and transfer voltages to shutter the camera ON and OFF for exposure periods appropriate for acquiring a range image of a scene, and optionally, a picture of the scene.

In the discussion, unless otherwise stated, adverbs such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended. Unless otherwise indicated, the word "or" in the specification and/or claims is considered to be the inclusive "or" rather than the exclusive or, and indicates at least one of, or any combination of items it conjoins This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical features that appear in more than one figure are generally labeled with a same numeral in all the figures in which they appear. A label labeling an icon or other graphical indicia representing a given feature of an embodiment of the invention in a figure may be used to reference the given feature. Dimensions of components and features shown in the figures are chosen for convenience and clarity of presentation and are not necessarily shown to scale.

FIG. 1B schematically shows electric equipotential field lines in a multimode pixel shown in FIG. 1A when all transfer gates in the pixel are electrified with a transfer voltage, in accordance with an embodiment of the invention;

FIGS. 1C-1F schematically show electric equipotential field lines in a multimode pixel shown in FIG. 1A with different ones of the transfer gates in the pixel electrified with a transfer voltage, in accordance with an embodiment of the invention;

FIG. 2A schematically shows a TOF-3D camera comprising a multimode photosensor imaging a scene to acquire a range image of the scene, in accordance with an embodiment of the invention;

DETAILED DESCRIPTION

Figure 1A:
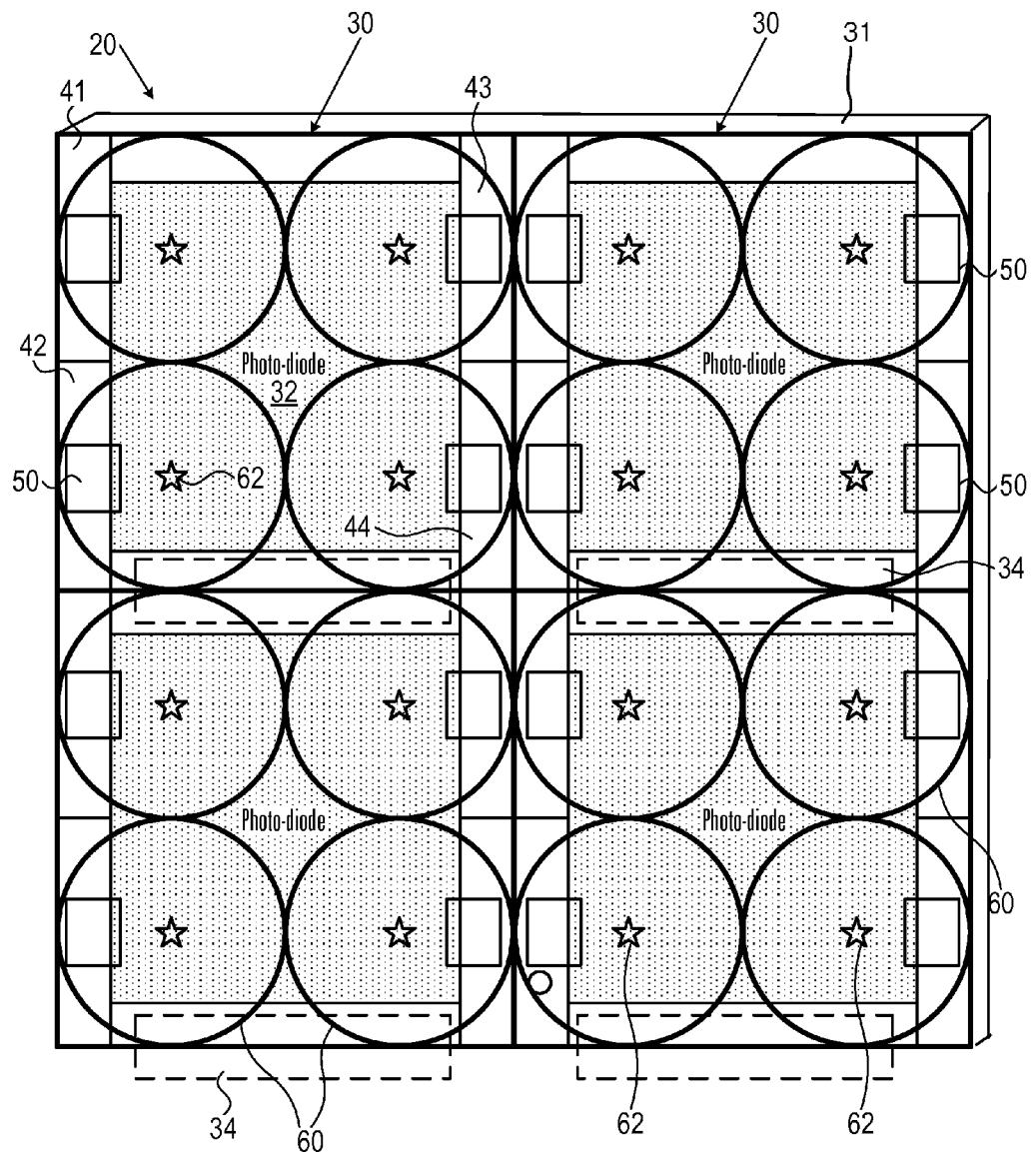
FIG. 1A schematically shows a multimode photosensor comprising multimode pixels, in accordance with an embodiment of the invention.

FIG. 1A schematically shows a simplified top view of a portion of a multimode photosensor 20 comprising pixels 30, also referred to as multimode pixels 30, formed in a suitable substrate 31 in accordance with an embodiment of the invention. Multimode photosensor 20 may be a CCD or CMOS photosensor, and is assumed by way of example to be a CMOS photosensor that accumulates photoelectrons from electron-hole pairs generated by light incident on photodiodes (see below) comprised in pixels 30 to register amounts of light incident on the pixels. Features of pixels 30 shown in FIG. 1A and figures that follow are not necessarily at a same depth in the pixels. The figures show schematic projections of the features onto a top surface, assumed to lie in the page of the figures, of multimode photosensor 20 that indicate relative lateral locations of the features.

Each multimode pixel 30 optionally comprises a photodiode 32 and four photoelectron storage regions 41, 42, 43, and 44. A transfer gate 50 overlays each storage region 41, 42, 43, and 44, and optionally a small region of photodiode 32. Components of pixel 30 are optionally formed on a heavily n-doped silicon substrate 31 (not shown) on which an epitaxial p-doped layer (not shown) is formed. Photodiode 32 may comprise a depletion zone generated at a junction of an n-doped region formed in the p-doped epitaxial layer. Storage regions 41, 42, 43, and 44 may be portions of a buried n-doped channel. Transfer gates 50 overlying storage regions 41, 42, 43, and 44 are formed using any of various suitable conducting materials such as a metal, or polysilicon. Each pixel 30 may comprise readout circuitry 34 configured to provide a measure of an amount of photocharge accumulated in each storage region 41, 42, 43, and 44 independent of an amount of photocharge accumulated in other of the storage regions in pixel 30. Whereas photodiode 32 is indicated as rectangular a photodiode in a multimode pixel in accordance with an embodiment of the invention may have a shape other than rectangular. By way of example, the photodiode may have a polygonal shape other than rectangular, or be circular or irregular.

An array of microlenses 60 overlays portions of photodiode 32. Optionally, the array of microlenses comprises a microlens 60 for each given storage region 41, 42, 43, and 44 that directs light incident on the microlens to a region of photodiode 32 closer to the given storage region than to other storage regions. In FIG. 1A a star icon 62 in a microlens 60 represents a focal region of microlens 60 to which the microlens directs light. In an embodiment of the invention, as shown in FIG. 1A the array of microlenses 60 is advantageously configured so that the array overlays substantially all of photodiode 32 and in addition may overlay areas outside of photodiode 32. Optionally, all microlenses 60 are circular, have a same diameter, and are arrayed in a rotationally symmetric configuration of order four.

In an embodiment of the invention, a controller (not shown in FIG. 1A) controls voltages applied to substrate 31 and transfer gates 50 to shutter multimode photosensor 20 ON and OFF and direct photoelectrons generated in pixels 30 responsive to incident light to selected storage regions 41, . . . , 44 of the pixels. In an embodiment of the invention the controller applies a voltage, $V_{ON}$ to shutter multimode photosensor 20 ON, and a voltage $V_{OFF}$ to substrate 31 to shutter multimode photosensor 20 OFF.

$V_{OFF}$ is a voltage more positive than a transfer voltage applied by the controller to a transfer gate 50, and when applied to substrate 31, photoelectrons in multimode pixels 30 drain to substrate 31, are not accumulated in any of storage regions 41, . . . , 44, and are discarded. $V_{ON}$ is a voltage, optionally a common, ground voltage, which is less positive than a transfer voltage "$V_{G+}$" applied by the controller to a transfer gate 50. When the controller applies $V_{ON}$ to substrate 31 and a transfer voltage $V_{G+}$ to a transfer gate 50 associated with a given storage region 41, . . . , 44, of a pixel 30, photoelectrons generated in photodiode 32 do not drain to substrate 31. The transfer voltage $V_{G+}$ generates an electric field in photodiode 32 that applies force to photoelectrons in the photodiode which causes the photoelectrons to drift toward and be accumulated in the storage region associated with the transfer gate. By maintaining substrate 31 at voltage $V_{ON}$ and selectively applying transfer voltages $V_{G+}$ to gates 50, the controller may operate multimode photosensor 20 to provide different sequences and types of exposure periods for a camera comprising the multimode photosensor, and provide the camera with different spatial resolutions for acquiring images of a scene.

By way of example, FIG. 1B schematically shows a multimode pixel 30 operating in a high spatial resolution mode in which the controller simultaneously electrifies all transfer gates 50 comprised in the pixel with a same $V_{G+}$. Shading of a transfer gate 50 indicates that transfer gate 50 is electrified by a transfer voltage $V_{G+}$. The transfer voltage that electrifies each transfer gate 50 generates an electric field in photodiode 32 that attracts photoelectrons to the storage region from a portion of photodiode 32 that is adjacent the storage region. A portion of photodiode 32 from which a storage region 41, 42, 43, 44 accumulates photoelectrons when the storage region's transfer gate 50 is electrified with a transfer voltage may be referred to as a "collection region" of the photodiode. Contour lines 70 in a collection region of a storage region 41, 42, 43, 44 represent electric equipotential surfaces, and are hereinafter also referred to as "equipotential surfaces" or "equipotential lines", of the generated electric field. Direction of the electric field at a location in photodiode 32 is perpendicular to equipotential surface 70 at the location, and strength of the electric field is inversely proportional to distance between equipotentials at the location. "Field" arrows 71 in FIG. 1B schematically indicate direction of the electric fields generated by electrified transfer gates 50 at various locations in photodiode 32.

For the configuration of storage regions 41, . . . , 44, transfer gates 50, and simultaneous electrification of transfer gates 50 by a same transfer voltage $V_{G+}$ shown in FIG. 1B, the respective collection regions of storage regions 41, 42, 43, 44 are substantially the same shape and size, and the electric field in adjacent collection regions are substantially mirror images of each other. The collection region of a given storage region 41, 42, 43, 44 comprises that portion of photodiode 32 that lies under microlens 60 associated with the given storage region. In addition, the collection region of the given storage region may comprise regions of photodiode 32 that are not overlaid by the associated microlens but are closer to the associated microlens than to microlenses of other of storage regions. The regions of photodiode 32 closer to the associated microlens 60 of a given storage region 41, 42, 43, 44 included in the collection region of the given storage region may be referred to as peripheral regions of the collection region.

Photoelectrons accumulated by each storage region 41, 42, 43, 44 from its associated collection region are generated by light directed to the collection region by microlenses 60 overlying the collection region and light incident on the peripheral regions of the collection region. However, as noted above and indicated by the configuration of microlenses 60 shown in FIGS. 1A and 1B, microlenses 60 overlay regions of pixel 30 outside of photodiode 32. A microlens 60 associated with a given storage region 41, 42, 43, 44 may collect and direct light to the storage region's collection region from a region of pixel 30 that may be substantially larger than the collection region. Each storage region 41, 42, 43, 44 and its associated microlens 60 comprised in a pixel 30 may therefore operate as an independent pixel smaller than pixel 30 and having dimensions substantially determined by dimensions of the associated microlens.

FIG. 1C schematically shows a pixel 30 operating in a low spatial resolution mode in which the controller applies a voltage $V_{ON}$ to substrate 31 and a transfer voltage $V_{G+}$ only to transfer gate 50 associated with storage region 41. Transfer gates 50 associated with storage regions 42, 43, 44 may be floating or electrified to $V_{ON}$. Transfer voltage $V_{G+}$ applied to transfer gate 50 associated with storage region 41 generates an electric field that operates to move photoelectrons provided by electron-hole pairs generated substantially anywhere in photodiode 32 to storage region 41. Equipotential lines 70 indicate a configuration of the generated electric field, and field arrows 71 schematically indicate direction of the electric field at various locations in photodiode 32. In the low resolution mode multimode pixel 30 has a spatial resolution determined substantially by the native dimensions of the pixel, and intensity of light incident on the pixel may be determined responsive to a measure of an amount of photoelectrons accumulated in storage region 41 optionally provided by readout circuitry 34.

It is noted that operating in the low spatial resolution mode schematically shown in FIG. 1C, multimode pixel 30 provides a spatial resolution poorer by a factor of about four relative to a spatial resolution provided by the pixel operating in the high spatial resolution mode. However, for a same intensity of incident light and a same exposure period, a pixel 30 operating in the low spatial resolution mode accumulates about four times as many photoelectrons in a storage region 41, 42, 43, or 44 used to store photoelectrons generated in photodiode 32 as does the pixel when operating in the high resolution mode. Therefore, if a particular minimum number photoelectrons accumulated in a storage region 41, 42, 43, or 44 is characterized by advantageous magnitude of shot noise, pixel 30 provides the minimum number for an intensity of incident light that is about four times less than an intensity for which the pixel provides the minimum operating in the high spatial resolution mode. As a result multimode photosensor 20 may advantageously be operated in the low spatial resolution mode when used to image a scene under conditions of low illumination.

FIGS. 1D, 1E and 1F schematically show pixel 30 operating in a low spatial resolution mode similar to the low spatial resolution mode shown in FIG. 1C but with transfer voltage $V_{G+}$ applied to transfer gates 50 associated respectively with storage regions 42, 43 and 44.

By way of a numerical example, a multimode photosensor 20 may comprise multimode pixels 30 characterized by a pitch less than or equal to about 15 μm (micrometers). Each multimode pixel 30 may comprise a photodiode 32 having a maximum lateral dimension equal to about 8 μm. For pixels 30 having pitches of about 10 μm or about 7 μm, photodiode 32 may have a maximum lateral dimension of about 6 μm or 4.5 μm respectively. A fill factor of a multimode pixel in accordance with an embodiment of the invention, may be equal to or greater than about 70%.

FIG. 2A schematically shows a TOF-3D camera 120 comprising a multimode photosensor 20 similar to multimode photosensor 20 shown in FIGS. 1A-1F operating to acquire a range image of a scene 130, in accordance with an embodiment of the invention. Scene 130 is schematically shown having objects 131 and 132.

TOF-3D camera 120, which is represented very schematically, comprises a lens system, represented by a lens 121 that images scene 130 on multimode photosensor 20. Optionally the TOF-3D camera comprises a light source 126, such as for example, a laser or a LED, or an array of lasers and/or LEDs, controllable to illuminate scene 130 with pulses of optionally IR (infrared) light. A controller 124 controls pulsing of light source 126 and imaging of scene 130 by multimode photosensor 20 with light reflected by features in the scene from light pulses emitted by light source 126. Controller 124 optionally applies voltages $V_{ON}$ and $V_{OFF}$ to shutter the multimode photosensor ON and OFF respectively. The controller may selectively apply transfer voltages $V_{G+}$ to transfer gates 50 associated with different photocharge storage regions 41, 42, 43, and 44 to image scene 130 on multimode photosensor 20 during different exposure periods. The different exposure periods are timed relative to times at which light source 126 transmits light pulses to illuminate scene 130, to acquire data for determining distances to features in scene 130 and acquire a range image of the scene.

In an embodiment of the invention, to acquire the data and thereby distances to features in scene 130, controller 124 turns ON multimode photosensor 20 and controls light source 126 to illuminate scene 130 with a train of light pulses schematically represented in FIG. 2A by a train 140 of rectangular pulses 141. Features in scene 130 reflect light from transmitted light pulse train 140 back to TOF-3D camera 120 in reflected light pulse trains. By way of example, FIG. 2A shows reflected light pulse trains 145 and 147 comprising respectively light pulses 146 and 148 reflected by features A and B of objects 132 and 131 respectively. Each reflected light pulse in a reflected light pulse train, such as a reflected light pulse 146 in reflected light pulse train 145 or a reflected light pulse 148 in light pulse train 147, has a pulse shape and width substantially the same as that of transmitted light pulses 141. Repetition period of reflected pulses in a same reflected light pulse train is substantially the same as the repetition period of transmitted light pulses 141 in transmitted light pulse train 140. Light pulses 141, 146 and 148 may have pulse widths "τ" optionally between about 10 to 30 ns (nanoseconds)

Following a predetermined delay after transmission of each transmitted light pulse 141, controller 124 applies a configuration of voltages to multimode photosensor 20 to determine an exposure period of multimode photosensor 20 during which multimode photosensor 20 registers light in light pulses reflected from the transmitted light pulse by features in scene 130. In an embodiment, controller 124 applies a transfer voltage $V_{G+}$ to a transfer gate 50 associated with at least one storage region 41, 42, 43, or 44 and applies voltages $V_{ON}$ and $V_{OFF}$ to substrate 31 (FIG. 1A) of multimode photosensor 20 to determine timing and duration of the exposure period. During the exposure period photoelectrons generated by light incident on a pixel 30 of multimode photosensor 20 drift to and are accumulated in the at least one storage region 41, 42, 43, or 44, of the pixel for which transfer gate 50 is electrified by the transfer voltage.

An amount of light that a given pixel 30 registers during an exposure period from a reflected light pulse reflected from transmitted light pulse 141 by a feature in scene 130 imaged on the given pixel, is substantially proportional to a convolution of the exposure period and the reflected light pulse. The convolution is a function of the predetermined delay between a time of transmission of transmitted light pulse 141 and the exposure period, a distance from TOF-3D camera 120 of the imaged feature, and the shapes of the reflected light pulse and exposure period.

In an embodiment of the invention, controller 124 controls multimode photosensor 20 to register light in reflected light pulses reflected by features of scene 130 during three different type exposure periods. Graphs 181, 182, and 183 in FIG. 2B, FIG. 2C and FIG. 2D respectively show schematic representations of light pulses transmitted by light source 126 and exposure periods of pixels 30. The graphs illustrate the three type exposure periods and temporal relationships between the exposure periods and transmitted light pulses 141.

Figure 2B:
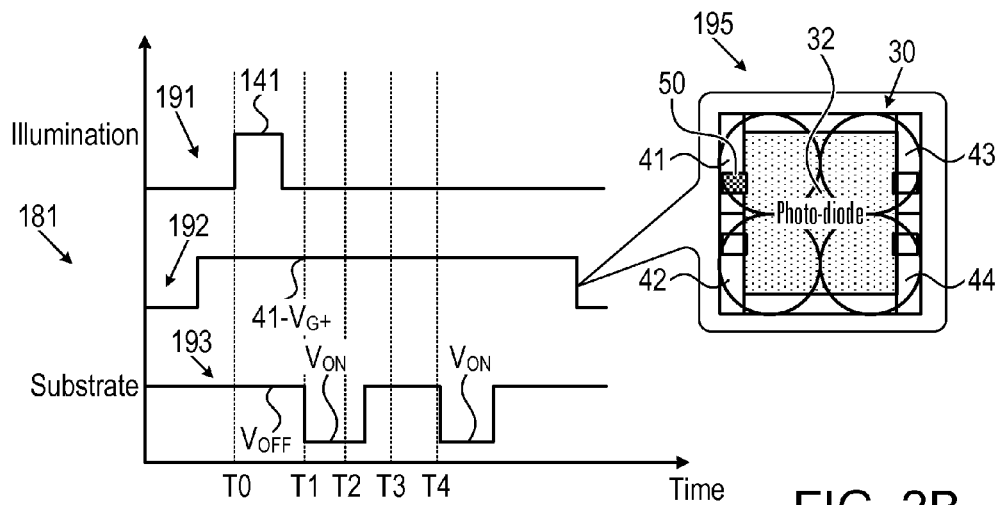
FIGS. 2B-2E show graphs illustrating operation and timing relationships of exposure periods of the multimode photosensor in the TOF-3D camera during imaging of the scene shown in FIG. 2A, in accordance with an embodiment of the invention.

Graph 181 shown in FIG. 2B illustrates a first type exposure period optionally comprising two consecutive, component exposure periods and referred to as a "dual exposure period". The graph schematically shows a transmitted light pulse 141 transmitted at a time $T_O$ along a graph line 191, labeled "illumination", voltage applied by controller 124 to a transfer gate 50 of a storage region 41, 42, 43, or 44 along a graph line 192, and voltage applied to substrate 31 of multimode photosensor 20 along a graph line 193, labeled "substrate". To accumulate photoelectrons during the compound exposure period, controller 124 optionally applies a transfer voltage $V_{G+}$ shown along graph line 192 only to transfer gates 50 associated with storage regions 41 of pixels 30. The transfer voltage $V_{G+}$ may be applied prior to transmission of light pulse 141. An inset 195 in FIG. 2B schematically shows a pixel 30 and a transfer gate 50 associated with storage region 41 of the pixel distinguished by shading to graphically indicate that transfer voltage $V_{G+}$ is applied to transfer gate 50 of only photocharge storage region 41. Graph line 192 is also labeled 41-$V_{G+}$ to indicate that only transfer gate 50 of storage region 41 is electrified with transfer voltage $V_{G+}$. Controller 124 applies a voltage $V_{OFF}$ to substrate 31 prior to transmission of light pulse 141. As long as $V_{OFF}$ is maintained on substrate 31, any photoelectrons produced by light incident on a photodiode 32 of a pixel 30 in multimode photosensor 20 drain to substrate 31 and photoelectrons are not accumulated by any storage regions of pixels in the multimode photosensor.

Following a delay time $T_1$, controller 124 applies voltage $V_{ON}$ (graph line 193) to substrate 31 of multimode photosensor 20 to register light during a first component exposure period of the dual exposure period and then again at a delay time $T_4$ during a second component exposure period of the dual exposure period. Optionally, the component exposure periods have a duration equal to that of transmitted light pulse 141, and by way of example, $T_4-T_1$ may be equal to or greater than about 6 ns and less than or equal to about 30 ns. During each of the component exposure periods for which controller 124 applies $V_{ON}$ to substrate 31, photoelectrons generated anywhere in photodiode 32 of a pixel 30 by light in a light pulse reflected from transmitted light pulse 141 drift to, and are accumulated in, storage region 41 of the pixel. An amount of light that storage region 41 of a given pixel 30 accumulates during the dual exposure period from a light pulse reflected from transmitted light pulse 131 by a feature in scene 130 imaged on the given pixel 30, is substantially proportional to a convolution of the dual exposure period and the reflected light pulse. In an embodiment of the invention controller 124 controls multimode photosensor 20 to accumulate photoelectrons during a dual exposure period for each of a plurality of light pulses 141 in pulse train 140.

Figure 2C:
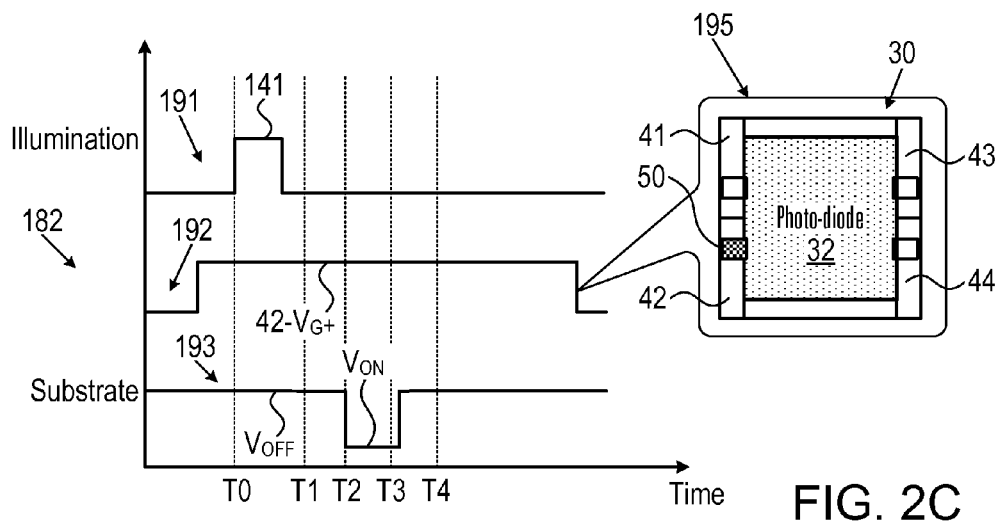

Graph 182 in FIG. 2C schematically illustrates a second type exposure period of the three exposure periods, in accordance with an embodiment of the invention. For the second type exposure period, controller 124 applies a transfer voltage to, optionally, transfer gate 50 associated only with storage region 42. In FIG. 2C graph line 192 in graph 182 is labeled 42-$V_{G+}$ and inset 195 shows transfer gate 50 of storage region 42 shaded to indicate that transfer gate 50 of only storage region 42 is electrified with transfer voltage $V_{G+}$. Controller 124 applies voltages $V_{ON}$ and $V_{OFF}$ to substrate 31 of multimode photosensor 20 (graph line 193) to initiate the second type exposure period at a time $T_2$ following a time $T_O$ at which a light pulse 141 is transmitted to illuminate scene 130. Optionally $T_2$ is later than $T_1$ by a time delay $\Delta T_{12}$ and earlier than $T_4$. By way of example, $\Delta T_{12}$ may be equal to or greater than about 2 ns and less than or equal to about 10 ns. During the second type exposure period, photoelectrons generated by incident light in a light pulse reflected from transmitted light pulse 141 (graph line 191) are accumulated in storage region 42. In an embodiment of the invention controller 124 controls multimode photosensor 20 to accumulate photoelectrons during a second type exposure period for each of a plurality of light pulses 141 in pulse train 140.

Figure 2D:
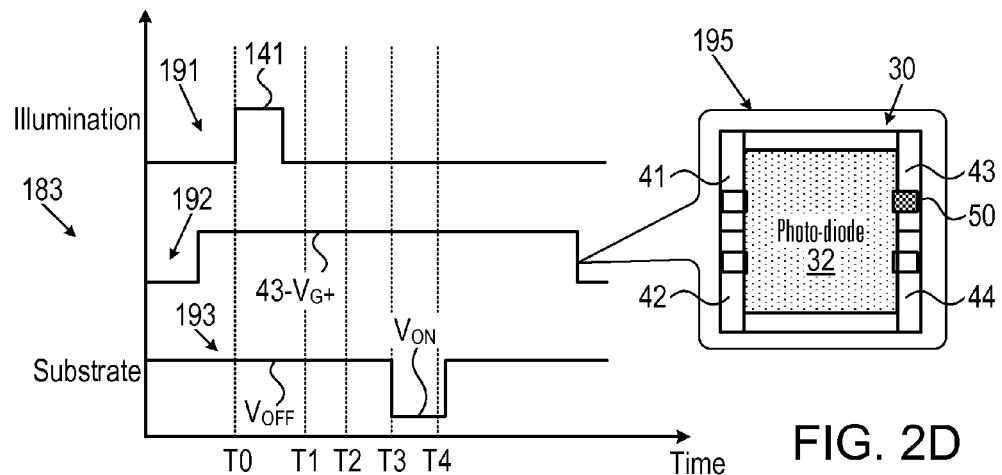

Graph 183 in FIG. 2D schematically illustrates the third type exposure period of the three exposure periods, in accordance with an embodiment of the invention. The third type exposure period is optionally similar to the second type exposure but begins at a time $T_3$ which may be earlier than $T_4$ and may be later than $T_2$ by a period of time $\Delta T_{23}$. By way of example $\Delta T_{23}$ may be equal to or greater than about 2 ns and less than or equal to about 10 ns. For the third type exposure period controller 124 applies a transfer voltage to, optionally, only transfer gate 50 associated with storage region 43. In FIG. 2D graph line 192 in graph 183 is labeled 43-$V_{G+}$ and inset 195 shows transfer gate 50 of storage region 43 shaded to indicate that only transfer gate 50 of storage region 43 is electrified with transfer voltage $V_{G+}$. During the third type exposure period, photoelectrons generated by incident light in a light pulse reflected from transmitted light pulse 141 are accumulated in storage region 43. In an embodiment of the invention controller 124 controls multimode photosensor 20 to accumulate photoelectrons during a third type exposure period for each of a plurality of light pulses 141 in pulse train 140.

Figure 2E:
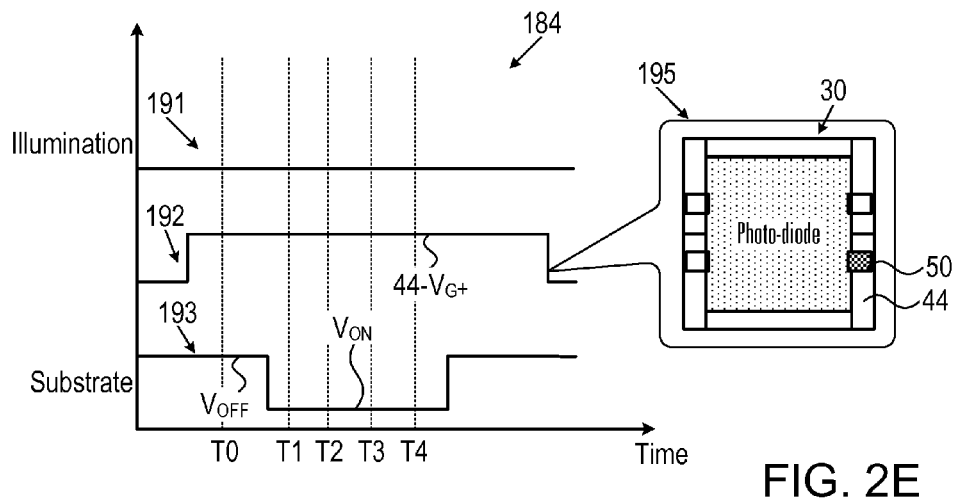

In an embodiment of the invention controller 124 controls multimode photosensor 20 to image scene 130 during an exposure period when the scene is not illuminated with light pulses to determine an amount of background light that reaches TOF-3D camera 120. Optionally controller 124 operates multimode photosensor 20 as schematically illustrated in graph 184 in FIG. 2E, and applies a transfer voltage $V_{G+}$ to transfer gate 50 only of photocharge storage region 44 to accumulate photoelectrons in storage region 44 during an exposure period determined by a voltage $V_{ON}$.

Following accumulation of photoelectrons in storage regions 41, 42, 43, and 44, controller 124 acquires a frame of multimode photosensor 20 to acquire voltages that provide measures of amounts of photoelectrons accumulated in storage regions of 41, 42, 43, and 44 of each multimode pixel 30. Controller 124 corrects the measured amounts of photoelectrons accumulated in storage regions 41, 42, and 43 of each pixel 30 for photoelectrons accumulated in the storage regions due to background light responsive to the measured amount of photoelectrons accumulated in storage region 44 of the pixel. The corrected measures for storage regions 41, 42, and 43 of pixel 30 are proportional to the convolutions of light pulses reflected by a feature in scene 130 imaged on the pixel from transmitted light pulses 141 during the dual exposure period, and the second and third type exposure periods respectively. Controller 124 uses the measures of the convolutions to determine a distance to the feature from TOF-3D camera 120.

For example, the corrected measures for storage regions 41, 42, and 43 for a pixel 30 on which feature A of object 132 (FIG. 2A) is imaged provides measures of the convolutions of the dual, second type, and third type exposure periods with reflected light pulses 146. Controller 124 may use the measures to determine a distance of feature A from TOF-3D camera 120.

Figure 2F:
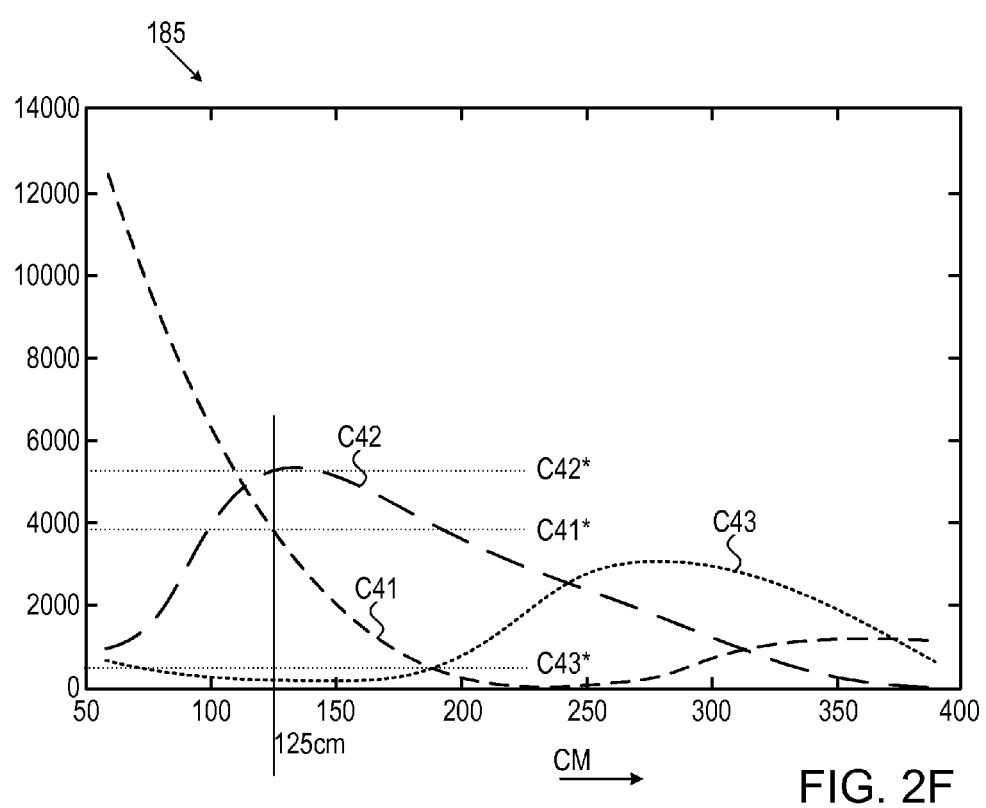
FIG. 2F shows a graph of data acquired by the TOF-3D camera used to provide a range image of the scene shown in FIG. 2A, in accordance with an embodiment of the invention.

By way of example, let the convolutions determined for photocharge storage regions 41, 42 and 43 of a given pixel 30 imaging a feature in scene 130 be represented by C41, C42, and C43 respectively. Values of C41, C42, and C43 are shown in a graph 185 in FIG. 2F as functions of distance of the feature in centimeters (cm) shown along an abscissa of the graph. An ordinate of the graph is graduated in arbitrary units. The distance of the feature imaged on the given pixel may be determined from the values of C41, C42, and C43 determined for the given pixel. Graph 185 shows the determined values represented by C41*, C42*, and C43*. From the graph it is seen that the determined values are most compatible with a value for the distance of the imaged feature equal to about 125 cm.

Figure 3:
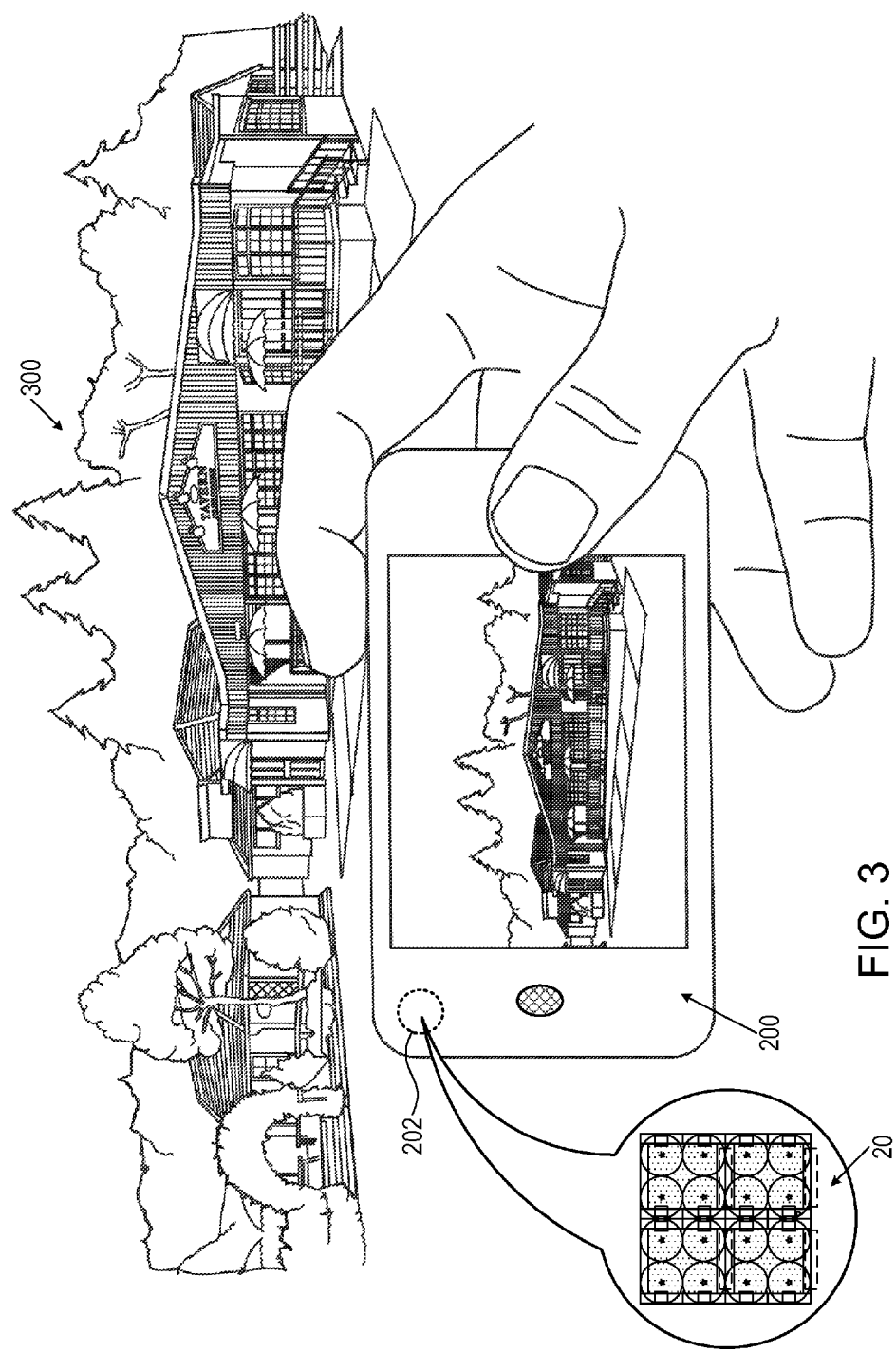
FIG. 3 schematically shows a smartphone comprising a multimode photosensor in accordance with an embodiment of the invention.

In an embodiment of the invention a photosensor similar to multimode photosensor 20 may be comprised in a camera that operates to acquire pictures of a scene, in accordance with an embodiment of the invention. By way of example, FIG. 3 schematically shows a smartphone 200 comprising a camera 202 having a multimode photosensor 20, in accordance with an embodiment of the invention. FIG. 3 schematically shows smartphone camera 202 being used to image a scene 300.

In an embodiment of the invention a controller (not shown) in smartphone 200 controls multimode photosensor 20 to operate in a high spatial resolution mode or a low spatial resolution mode responsive to a measure of intensity of light collected by smartphone camera 202 from scene 300 and an intensity threshold. The intensity of the collected light may be determined by any suitable light meter and/or application (not shown) comprised in smartphone 200. If the intensity of light is greater than the intensity threshold, the controller may control multimode photosensor 20 to operate in a high spatial resolution mode to image scene 300. If the intensity of collected light is less than the intensity threshold, the controller may control multimode photosensor 20 to operate in the low spatial resolution mode to image scene 300.

There is therefore provided in accordance with an embodiment of the invention a multimode photosensor having a plurality of light sensitive pixels formed on a substrate, each pixel comprising: a light sensitive region in which incident light generates photocharge carriers; a plurality of storage regions for accumulating photocharge carriers generated in the light sensitive region; a transfer gate associated with each storage region of the plurality of storage regions that is electrifiable to cause photocharge in the light sensitive region to drift to the storage region; and an array of microlenses comprising at least one microlens for each storage region of the plurality of storage regions that directs light incident on the at least one microlens to a region of the light sensitive region that is closer to the storage region than to other storage regions of the plurality of storage regions.

Optionally, the array of microlenses comprises a single microlens for each storage region. Alternatively or additionally the microlens array may exhibit rotational symmetry. Optionally, the rotational symmetry has an order equal to a number of the plurality of storage regions. In an embodiment of the invention, the number of the plurality of storage regions is equal to two. In an embodiment of the invention the number of the plurality of storage regions is equal to or greater than four.

In an embodiment of the invention the multimode photosensor comprises a controller that electrifies a transfer gate associated with a storage region to cause photocharge generated in the light sensitive region to drift to the storage region. Optionally, the controller electrifies a transfer gate of only one storage region with a transfer voltage to cause photocharge generated at substantially any location in the light sensitive region to drift to the one storage region. Alternatively or additionally the controller simultaneously electrifies the transfer gate associated with each storage region with a same transfer voltage to cause photocharge generated at locations in the light sensitive region closest to a storage region to drift to the storage region.

In an embodiment of the invention, the controller electrifies the substrate to shutter the multimode photosensor ON and OFF.

In an embodiment of the invention the photosensitive region comprises a photodiode. In an embodiment the photosensitive region comprises a photogate.

There is further provided in accordance with an embodiment of the invention, a time of flight (TOF) three dimensional (3D) camera that images a scene to determine distances to features in the scene, the TOF-3D camera comprising: a light source that transmits a train of light pulses to illuminate the scene; a multimode photosensor in accordance with an embodiment of the invention that receives light reflected by the features from the transmitted light pulses; and a controller that shutters the photosensor ON and OFF following each light pulse to accumulate photocharge generated in the photodiodes of pixels in the multimode photosensor by light from the light pulses reflected by the features during an exposure period chosen from a plurality of different exposure periods; wherein the controller electrifies transfer gates of different storage regions to accumulate photocharge generated during different exposure periods in different storage regions, determines amounts of accumulated photocharge in different storage regions from a same frame of the multimode photosensor and uses the amounts to determine distances to features in the scene.

Optionally, the different exposure periods comprise exposure periods that begin at different times following a time at which a light pulse in the train of light pulses is transmitted. Additionally or alternatively the different exposure periods may comprise exposure periods having different durations. The different exposure periods may comprise exposure periods having different shape.

In an embodiment of the invention, a number of the plurality of different exposure periods is equal to or greater than two. Optionally, a number of the plurality of storage regions is equal to or greater than the number of the plurality of different exposure periods.

There is further provided in accordance with an embodiment of the invention, a camera that images a scene to acquire a picture of the scene, the camera comprising a multimode photosensor in accordance with an embodiment of the invention that receives light from the scene; a light meter that determines an intensity of light reaching the camera from the scene; and a controller that controls electrification of transfer gates responsive to intensity of light measure by the light meter. Optionally, the controller controls electrification of the transfer gates responsive to a threshold light intensity. If the measured intensity is less than the threshold the controller may electrify a transfer gate of only one storage region with a transfer voltage. If the measured intensity is greater than the threshold the controller may simultaneously electrify the transfer gate associated with each storage region with a same transfer voltage.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments.

The invention claimed is:

1. A photosensor having a plurality of light sensitive pixels having variable spatial resolution formed on a substrate, each pixel comprising:
   a light sensitive region in which incident light generates photocharge carriers;
   a plurality of storage regions for accumulating photocharge carriers generated in the light sensitive region;
   a transfer gate associated with each storage region of the plurality of storage regions that is electrifiable to cause photocharge in different size portions of the light sensitive region to drift to the storage region and vary thereby the spatial resolution of the pixel; and an array of microlenses comprising at least one microlens for each storage region of the plurality of storage regions that directs light incident on the at least one microlens to a region of the light sensitive region that is closer to the storage region than to other storage regions of the plurality of storage regions.

2. The photosensor according to claim 1 wherein the array of microlenses comprises a single microlens for each storage region.

3. The photosensor according to claim 1 wherein the microlens array exhibits rotational symmetry.

4. The photosensor according to claim 3 wherein the rotational symmetry has an order equal to a number of the plurality of storage regions.

5. The photosensor according to claim 1 wherein the number of the plurality of storage regions is equal to two.

6. The photosensor according to claim 1 wherein the number of the plurality of storage regions is equal to or greater than four.

7. The photosensor according to claim 1 and comprising a controller that electrifies a transfer gate associated with a storage region to cause photocharge generated in the light sensitive region to drift to the storage region.

8. The photosensor according to claim 7 wherein the controller electrifies a transfer gate of only one storage region with a transfer voltage to cause photocharge generated at substantially any location in the light sensitive region to drift to the one storage region.

9. The photosensor according to claim 7 wherein the controller simultaneously electrifies the transfer gate associated with each storage region with a same transfer voltage to cause photocharge generated at locations in the light sensitive region closest to a storage region to drift to the storage region.

10. The photosensor according to claim 7 wherein the controller electrifies the substrate to shutter the photosensor ON and OFF.

11. The photosensor according to claim 1 wherein the light sensitive region comprises a photodiode.

12. A time of flight (TOF) three dimensional (3D) camera that images a scene to determine distances to features in the scene, the TOF-3D camera comprising:
 a light source that transmits a train of light pulses to illuminate the scene;
 a photosensor according to claim 1 that receives light reflected by the features from the transmitted light pulses; and
 a controller that shutters the photosensor ON and OFF following each light pulse to accumulate photocharge generated in the photodiodes of pixels in the photosensor by light from the light pulses reflected by the features during an exposure period chosen from a plurality of different exposure periods;
 wherein the controller electrifies transfer gates of different storage regions to accumulate photocharge generated during different exposure periods in different storage regions,
 determines amounts of accumulated photocharge in different storage regions from a same frame of the photosensor and uses the amounts to determine distances to features in the scene.

13. The TOF-3D camera according to claim 12 wherein the different exposure periods comprise exposure periods that begin at different times following a time at which a light pulse in the train of light pulses is transmitted.

14. The TOF-3D camera according to claim 12 wherein the different exposure periods comprise exposure periods having different durations.

15. The TOF-3D camera according to claim 12 wherein a number of the plurality of different exposure periods is equal to or greater than two.

16. The TOF-3D camera according to claim 15 wherein a number of the plurality of storage regions is equal to or greater than the number of the plurality of different exposure periods.

17. A camera that images a scene to acquire a picture of the scene, the camera comprising:
 a photosensor according to claim 8 that receives light from the scene;
 a light meter that determines an intensity of light reaching the camera from the scene; and
 a controller that controls electrification of transfer gates responsive to intensity of light measure by the light meter.

18. The camera according to claim 17 wherein the controller controls electrification of the transfer gates responsive to a threshold light intensity.

19. The camera according to claim 18 wherein if the measured intensity is less than the threshold the controller electrifies a transfer gate of only one storage region with a transfer voltage.

20. The camera according to claim 19 wherein if the measured intensity is greater than the threshold the controller simultaneously electrifies the transfer gate associated with each storage region with a same transfer voltage.

* * * * *